United States Patent
Fuller et al.

(10) Patent No.: US 7,741,883 B2
(45) Date of Patent: Jun. 22, 2010

(54) METHOD OF SWITCHING AND SWITCHING DEVICE FOR SOLID STATE POWER CONTROLLER APPLICATIONS

(75) Inventors: Randy Fuller, Hillsburgh (CA); Liu Zhenning, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/176,535

(22) Filed: Jul. 21, 2008

(65) Prior Publication Data

US 2009/0289691 A1 Nov. 26, 2009

Related U.S. Application Data

(60) Provisional application No. 61/054,905, filed on May 21, 2008.

(51) Int. Cl.
H03K 3/00 (2006.01)
(52) U.S. Cl. .................. 327/108; 327/432; 327/433
(58) Field of Classification Search .......... 327/108, 327/432, 433
See application file for complete search history.

(56) References Cited

U.S. PATENT DOCUMENTS

| 5,602,897 | A | * | 2/1997 | Kociecki et al. | 378/101 |
| 5,610,507 | A | * | 3/1997 | Brittan | 323/350 |
| 5,932,934 | A | * | 8/1999 | Hofstetter et al. | 307/26 |
| 7,230,587 | B2 | * | 6/2007 | Onozawa et al. | 345/60 |
| 7,372,432 | B2 | * | 5/2008 | Lee | 345/60 |
| 7,417,409 | B2 | * | 8/2008 | Partridge | 323/222 |

OTHER PUBLICATIONS

High frequency power switch—Improved performance by MOSFETs and IGBTs connected in parallel Hoffmann, Klaus F.; Karst, Jens Peter Source: 2005 European Conference on Power Electronics and Applications, v 2005, 2005 European Conference on Power Electronics and Applications, 2005, p 1665784 Conference: 2005 European Conference on Power Electronics and Applications, Sep. 11-14, 2005, Dresden, Germany Publisher: Institute of Electrical and Electronics Engineers Computer Society.

Evaluating conduction loss of a parallel IGBT-MOSFET combination Kimball, Jonathan W; Chapman, Patrick L. Source: Conference Record—IAS Annual Meeting (IEEE Industry Applications Society), v 2, Conference Record of the 2004 IEEE Industry Applications Conference; 39th IAS Annual Meeting, 2004, p. 1233-1237 ISSN:0197-2618 CODEN: CIASDZ.

* cited by examiner

Primary Examiner—Kenneth B. Wells
(74) Attorney, Agent, or Firm—Oral Caglar, Esq.

(57) ABSTRACT

A solid state switching device (SSSD) for AC and DC high power solid state power controller includes, for DC applications, a MOSFET and an IGBT connected in parallel and an optional zener diode connecting a collector and a gate of the IGBT. For AC applications, the SSSD includes a "back to back" pair of MOSFETs connected in parallel with a pair of counter-parallel IGBTs, each in series with a diode, and, optionally, zener diodes "back to back" with conventional diodes connecting a collector and a gate of each of the IGBT. A method of switching establishes a sequence of turning on/off the MOSFET(s) and the IGBT(s) wherein the IGBT(s) turn on before and turn off after the MOSFET(s). A negative feedback prevents a voltage of SSSD rising above predetermined level.

16 Claims, 5 Drawing Sheets

METHOD OF SWITCHING AND SWITCHING DEVICE FOR SOLID STATE POWER CONTROLLER APPLICATIONS

BACKGROUND OF THE INVENTION

The present invention generally relates to solid state power controller technology and, more specifically, to devices and methods of switching in high power AC/DC solid state power controllers.

Solid State Power Controller (SSPC) technology is gaining acceptance as a modern alternative to the combination of conventional electromechanical relays and circuit breakers for commercial aircraft power distribution due to its high reliability, "soft" switching characteristics, fast response time, and ability to facilitate advanced load management and other aircraft functions.

While SSPCs with current rating under 15 A have been widely utilized in aircraft secondary distribution systems, power dissipation, voltage drop, and leakage current associated with solid state power switching devices pose challenges for using SSPCs in high voltage applications of aircraft primary distribution systems with higher current ratings.

A typical SSPC generally comprises a solid state switching device (SSSD), which performs the primary power on/off switching, and a processing engine, which is responsible for SSSD on/off control and a feeder wire protection.

Existing aircraft applications employ exclusively a metal oxide semiconductor field effect transistor (MOSFET) as a basic solid state component for building up the SSSD. It features easy control, bi-directional conduction characteristic, and resistive conduction nature with positive temperature coefficient. To increase the current carrying capability and reduce the voltage drop or power dissipation, the SSSD comprises multiple MOSFETs generally connected in parallel. However, this set up does not warrant an increased capability to handle higher fault current. During SSSD turn-off transients, generally, neither all the MOSFETs turn off simultaneously nor the fault current distributes evenly among the MOSFETs in such a short time. As a result, fault current capability of single MOSFET has to be considered as the worst case scenario in the design of SSSDs. Meanwhile, the resistance and, therefore, power dissipation of the MOSFET turned on increase significantly with its voltage ratings. That increase greatly limits the MOSFET potential applications in the high voltage environments, such as 115VAC, 230VAC, 270VDC, and 540VDC, etc., in the aircraft.

Similar to the MOSFET in gate controls, an insulated gate bipolar transistor (IGBT) features high current carrying capability, low conduction loss at high current, availability of high voltage ratings, etc. However, a greater than 1.7V voltage associated with IGBT on-state is still considered too high and would introduce errors at the voltage zero crossing detection. Furthermore, the limited reverse blocking capability makes use of the conventional IGBT difficult for AC applications and a diode would have to be added, further impacting the on state voltage. A newly developed reverse blocking IGBT (RB-IGBT) is designed for bi-directional power switching. But the inherent "dead band" associated with a greater than 2V on-state voltage of RB-IGBT results in noticeable distortions in the controlled current that are highly undesirable, if not unacceptable to existing Aerospace Electromagnetic Interference and Power Quality requirements, for power distribution applications.

As can be seen, there is a need for to provide a practical solution for the solid state power switch to be used in high power AC/DC SSPCs (either with higher current ratings, e.g. >15 A, or in higher voltage applications, e.g. ≧115VAC), particularly using existing commercially available semiconductors. There is also a need to provide such a solution, which will result in reduced power dissipation, improved reliability and fault current handling capability, and no current distortions.

SUMMARY OF THE INVENTION

In one aspect of the present invention, a method of switching a solid state switching device having at least one metal oxide semiconductor field effect transistor and at least one insulated gate bipolar transistor connected in parallel comprises the steps of connecting on demand a power input to a power output through the insulated gate bipolar transistor; delaying for the dissipation of inrush current of the insulated gate bipolar transistor; connecting the power input to the power output through the metal oxide semiconductor field effect transistor; disconnecting on demand the power input from the power output through the metal oxide semiconductor field effect transistor; delaying for switching off of the metal oxide semiconductor field effect transistor; and disconnecting the power input from the power output through the insulated gate bipolar transistor.

In another aspect of the present invention, a method of switching a solid state switching device having at least one metal oxide semiconductor field effect transistor and at least one insulated gate bipolar transistor connected in parallel comprises the steps of connecting on demand the power input to the power output through the insulated gate bipolar transistor; delaying for the dissipation of inrush current of the insulated gate bipolar transistor; connecting the power input to the power output through the metal oxide semiconductor field effect transistor; conveying negative feedback from the power output to the insulated gate bipolar transistor; disconnecting on demand the power input from the power output through the metal oxide semiconductor field effect transistor; delaying for switching off of the metal oxide semiconductor field effect transistor; and disconnecting the power input from the power output through the insulated gate bipolar transistor.

In a further aspect of the present invention, a solid state switching devide comprises a first metal oxide semiconductor field effect transistor; a first insulated gate bipolar transistor connected in parallel with the metal oxide semiconductor field effect transistor; and wherein the first metal oxide semiconductor field effect transistor turns on with a first predetermined delay after the first insulated gate bipolar transistor turns on and the first insulated gate bipolar transistor turns off with a second predetermined delay after the first metal oxide semiconductor field effect transistor turns off.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

The present invention, in its various embodiments, discloses an improved solid state switching device and a method of switching for high power AC/DC SSPCs either with current ratings higher than 15 A, or voltage applications higher than 28V, particularly, for high voltage applications of aircraft primary distribution systems.

The SSSD of present invention may improve reliability and fault current handling by relying on an IGBT based switch to handle switching transients and breaking up the fault current because a single IGBT typically has much higher current rating than a single MOSFET in similar size. The IGBT based switch may also provide over voltage protection for the SSSD during heavy inductive load switching off, fault current breaking up transients, and lightning transients. The SSSD of present invention may achieve high current ratings in SSPC applications for lower than 1.7V voltage drop by connecting in parallel additional MOSFETs without the limits of the fault current handling capability of a single MOSFET.

Figure 1A:
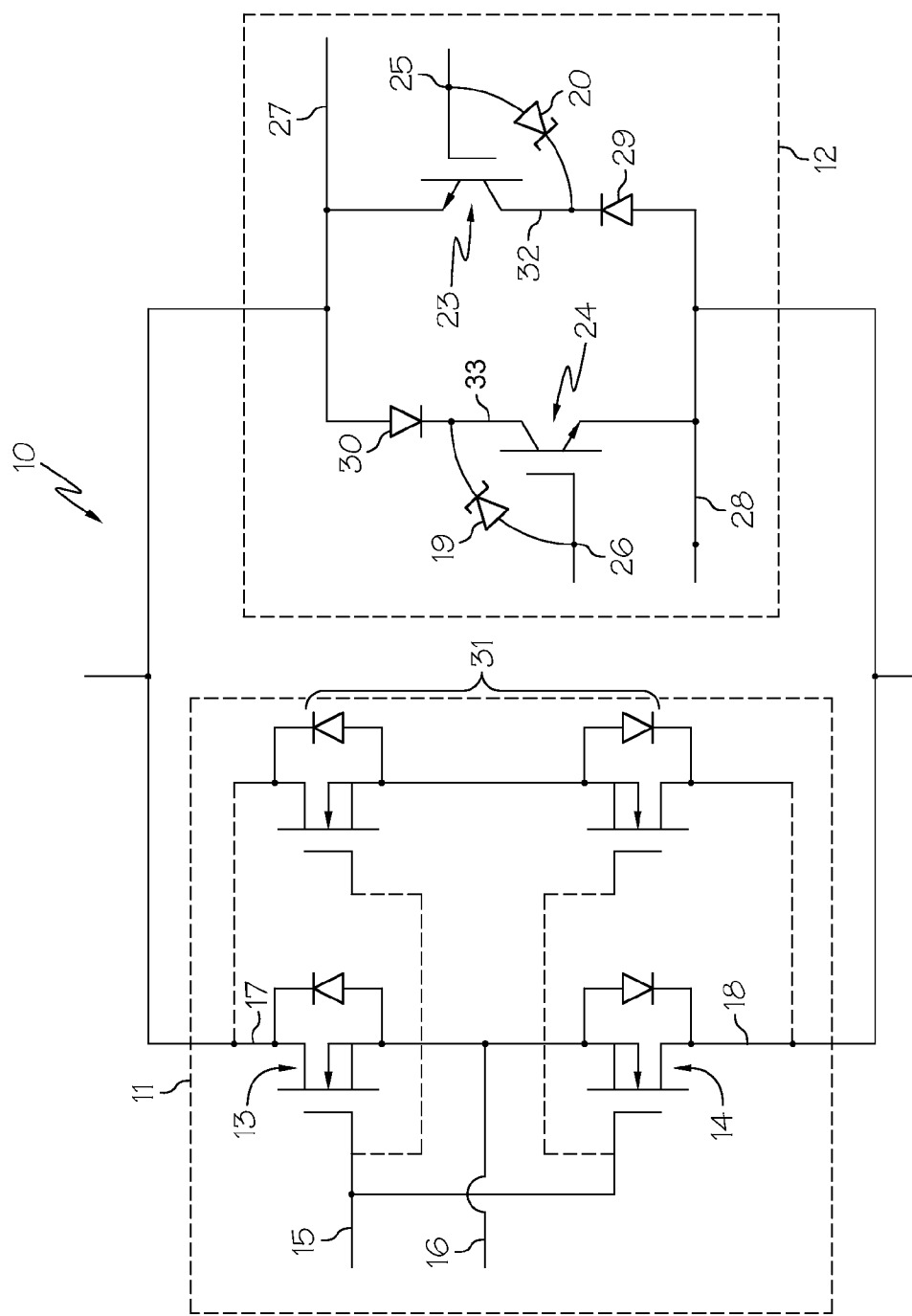
FIG. 1A depicts a conceptual schematic of a first embodiment of an SSSD for AC application according to present invention.

Referring to FIG. 1A, in one embodiment, a schematic conceptually represents an AC SSSD 10 which may include two types of solid state bi-directional switches 11 and 12 connected in parallel. For clearer illustration of the main concept, the schematic omits gate resistors and a current sensing mechanism well known in the art.

The solid state bi-directional switch 11 may include first and second MOSFETs 13 and 14 connected in a "back to back" fashion with a common gate 15, a common source 16 and drains 17 and 18. Multiple parallel pairs (one shown) 31 of MOSFETs may be added to the MOSFETs 13 and 14 for improved current carrying capability and voltage drop.

By external (on demand) on/off commands, a drive signal of the gate 15 may control the operation of the solid state bi-directional switch 11. The multiple pairs 31 of MOSFETs may act synchronously with the MOSFETs 13 and 14 thereby multiplying power-carrying capability of the switch 11.

The solid state bi-directional switch 12 may include first and second conventional IGBTs 23 and 24 with gates 25, 26 and emitters 27, 28 respectively and zener diodes 19 and 20. The zener diode 19 may be connected across the collector 33 of the IGBT 24 and the gate 26 as a feedback circuit for the IGBT 24 and, respectively, the zener diode 20 may be connected across the collector 32 of the IGBT 23 and the gate 25 as a feedback circuit for the IGBT 23. The zener diodes 19 and 20 may be forward biased toward the collectors 31 and 32 respectively. Diodes 29 and 30 may be connected in series with and forward biased toward collectors of the corresponding IGBTs 23 and 24 to provide them with the necessary reverse blocking capability in AC applications. By external (on demand) on/off commands, synchronized drive signals of the gates 25 and 26 may control the operation of the solid state bi-directional switch 12.

When the voltage across the switch 12 reaches the level of break down voltage of the zener diodes 19 and 20, either the zener diode 19 or zener diode 20, depending on polarity of the voltage, may turn on in the voltage-clamping mode. Consequently, one of the corresponding IGBT 23 and 24 may be driven into an "active region" and may adjust (clamp) the voltage across the switch 12 to that level. The diodes 30 and 29 may block forward biased current through the corresponding zener diodes 19 and 20.

Figure 1B:
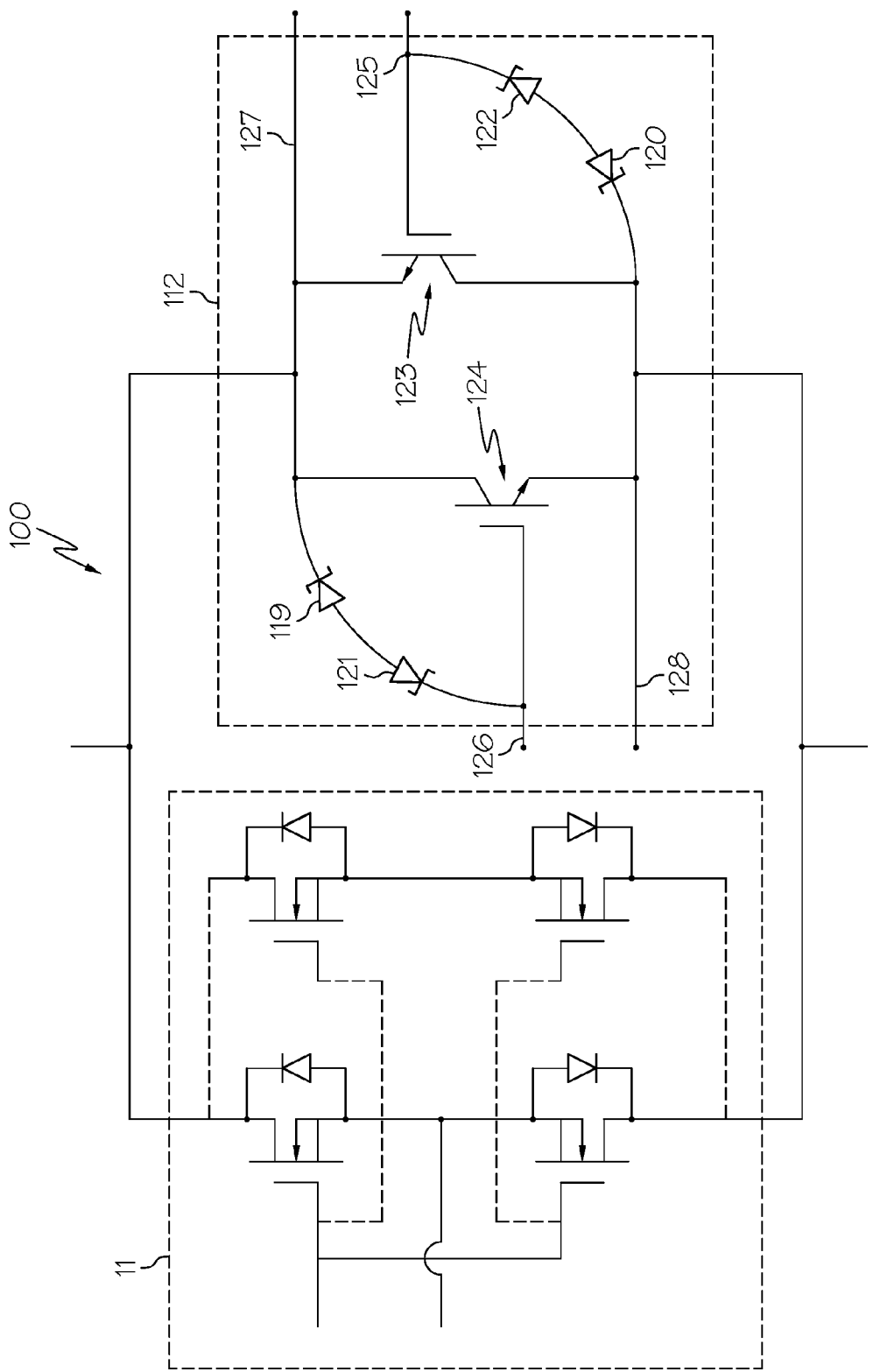
FIG. 1B depicts a conceptual schematic of another embodiment of an SSSD for AC application according to the present invention.

Referring to a schematic shown in FIG. 1B, in another embodiment, an AC SSSD 100 may include the switch 11 and a solid state bi-directional switch 112. The solid state bi-directional switch 112 may include first and second RB-IGBTs 123 and 124 with gates 125, 126, emitters 127, 128, zener diodes 119 and 120, and diodes 121 and 122. The zener diode 119 in series "back to back" with the diode 121 may be connected across the collector 127 of the RB-IGBTs 124 and the gate 126 as a feedback circuit for the RB-IGBTs 124 and, respectively, the zener diode 120 in series "back to back" with the diode 122 may be connected across the collector 128 of the RB-IGBTs 123 and the gate 125 as a feedback circuit for the RB-IGBTs 123. The zener diodes 119 and 120 may be forward biased toward the collectors 127 and 128 respectively. By external (on demand) on/off commands, synchronized drive signals of gates 125 and 126 may control the operation of the solid state bi-directional switch 112.

Figure 2:
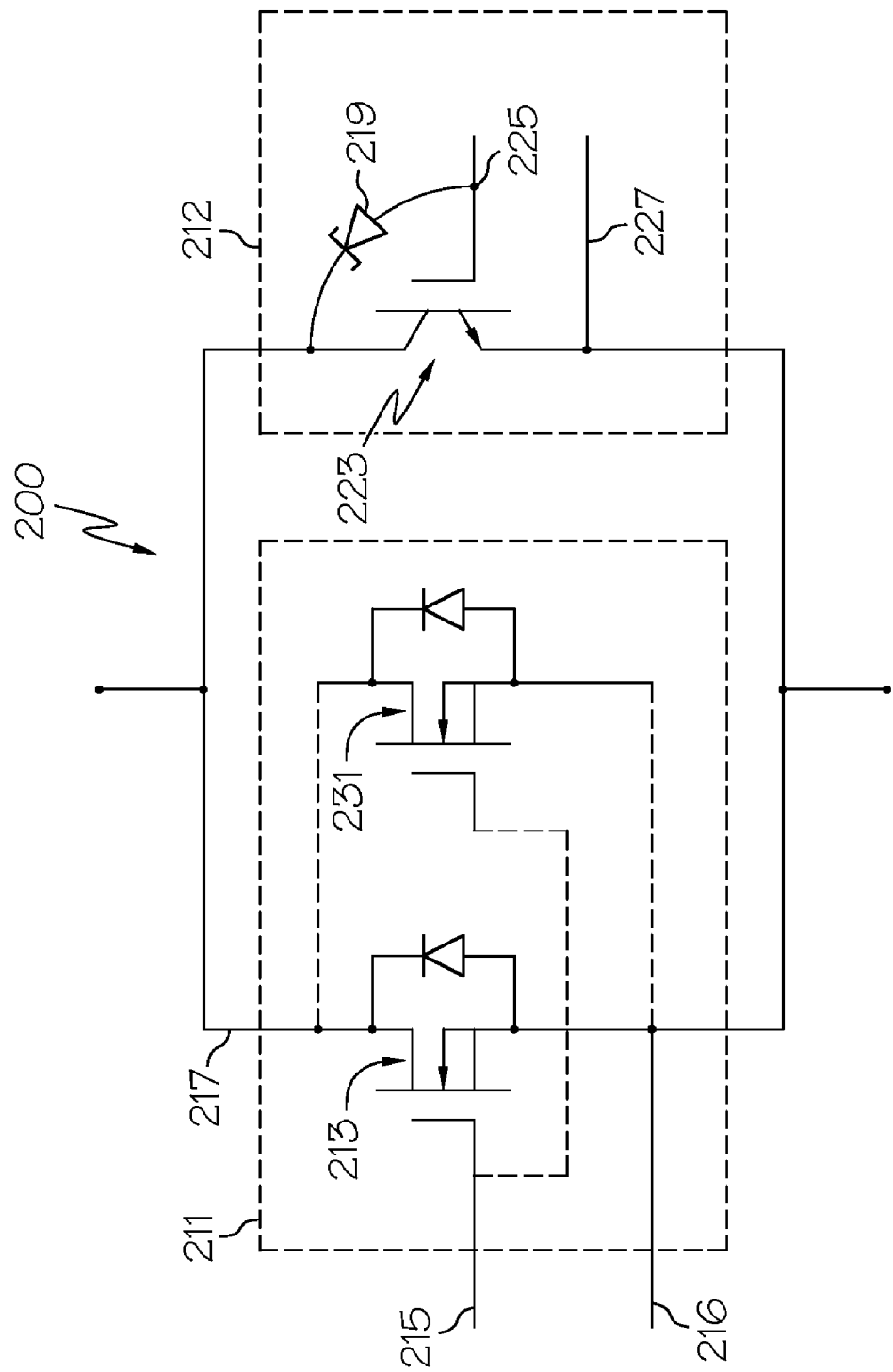
FIG. 2 depicts a conceptual schematic of embodiment of an SSSD for DC application according to the present invention.

Referring to FIG. 2, in yet another embodiment, a schematic conceptually represents a DC SSSD 200 having two types of solid state switches 211 and 212 connected in parallel. There as well, for clearer illustration of the main concept, the schematic omits gate resistors and a current sensing mechanism well known in the art. The solid state switch 211 may include a MOSFET 213 with a source 216 and a drain 217. Multiples of MOSFET 231 may be added to the MOSFETs 213 for improved current carrying capability and voltage drop. The solid state switch 212 may include IGBT 223 with a gate 225, an emitter 227, and a zener diode 219 connected across the collector 217 of the IGBT 223 and the gate 225 and forward biased toward drain 217.

By external (on demand) on/off commands, a drive signal of the gate 215 may control the operation of the solid state switch 211. When the voltage across the switch 212 reaches a level of break down voltage of zener diode 219, the zener diode 219 may turn on the solid state switch 212 in the voltage clamping mode. Consequently, the IGBT 223 may be driven into an "active region" and may adjust (clamp) the voltage across the switch 212 to that level. Multiple MOSFETs 231 may act synchronously with the MOSFET 213 multiplying power carrying capability of the switch 211. By external (on demand) on/off commands, the drive signal of the gate 225 may control the operation of the solid state switch 212.

Figure 3:
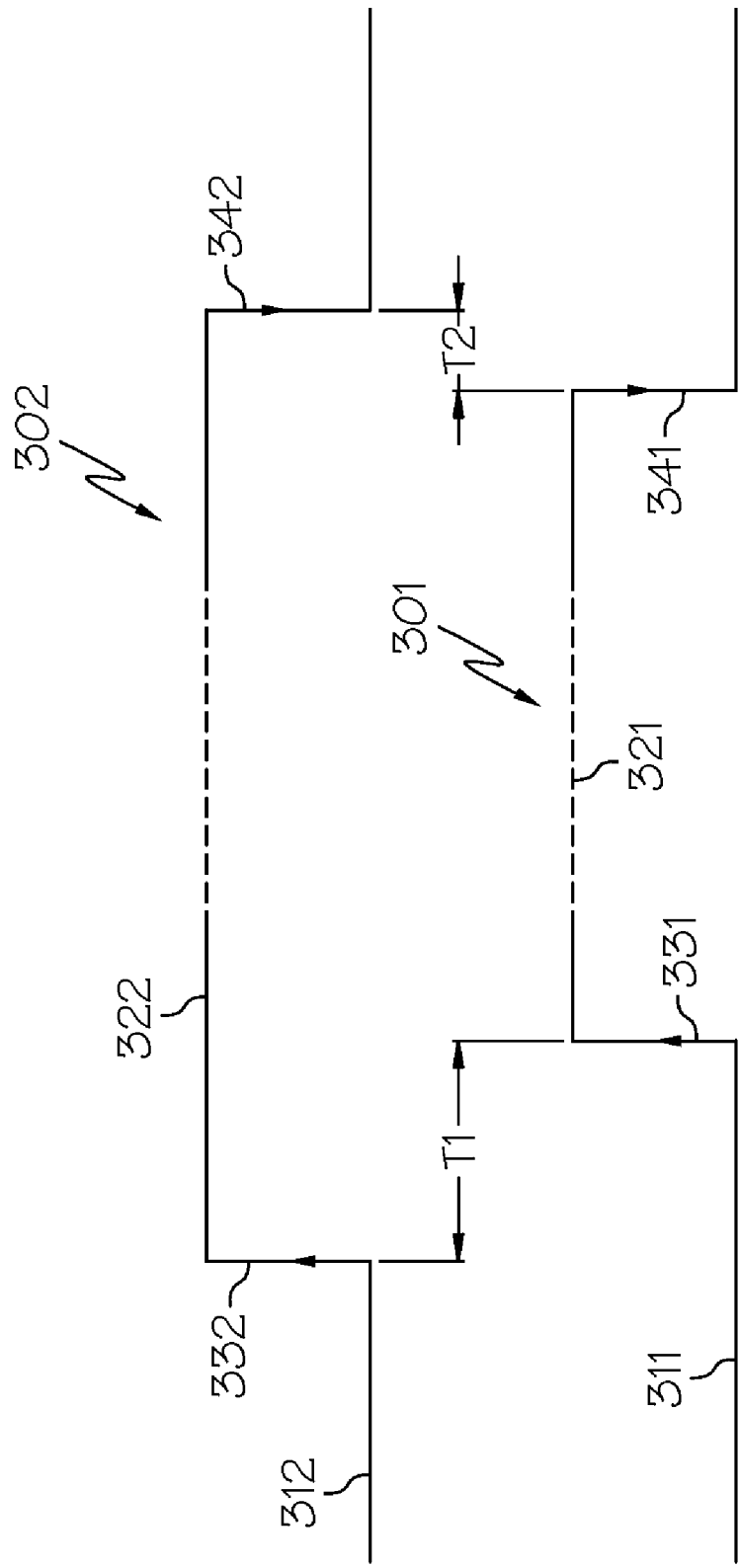
FIG. 3 depicts a switching sequence according to a method of the present invention.

The switching sequence of FIG. 3 depict an order of turning the SSSD 10 of FIG. 1A, 100 of FIG. 1B, and 200 of FIG. 2 on and off in accordance with the present invention, wherein graphs 301 and 302 represent the on/off state of MOSFET and IGBT respectively. Horizontal parts 311 and 312 represent the "off" state, while horizontal parts 321 and 322 characterize the "on" state in the graphs 301 and 302 respectively. Vertical parts 331 and 332 correspond to a turn on signal and vertical parts 341 and 342 signify a turn off signal in the graphs 301 and 302 respectively.

Switching the power controlled by the SSSD 10 of FIG. 1A, 100 of FIG. 1B, and 200 of FIG. 2 on requires an external command to generate the signal 332 turning on the IGBT 23,24 of FIG. 1A, 123,124 of FIG. 1B, and 223 of FIG. 2 first. After a delay T1 necessary for the dissipation of inrush current of the IGBT, the signal 331 turns the MOSFET 13, 14 of FIG. 1A and 213 of FIG. 2 on. Switching the power off requires an external command to generate the signal 341 turning the MOSFET off and, after a short delay T2 required for achieving the "off" state of the MOSFET, the signal 342 turns the IGBT off.

The SSSD of present invention would not generate current distortions, since when the voltage across the SSSD is below of "on" state voltage level of the IGBT in the switch 12 (112, 212), the switch 11 (211) may automatically take over the current conduction. For medium and high current applications, low power dissipation (voltage drop) can be achieved by generally relying on the switch 11 (211) for normal current conduction, and allowing the switch 12 (112, 212) to share the excessive current in cases of fault. For higher current applications, the switch 12 (112, 212) may share most of the conduction current during normal conduction without further increase of the power dissipation, as the on-state voltage of the IGBT would not change much with the drain current it conducts.

Figure 4:
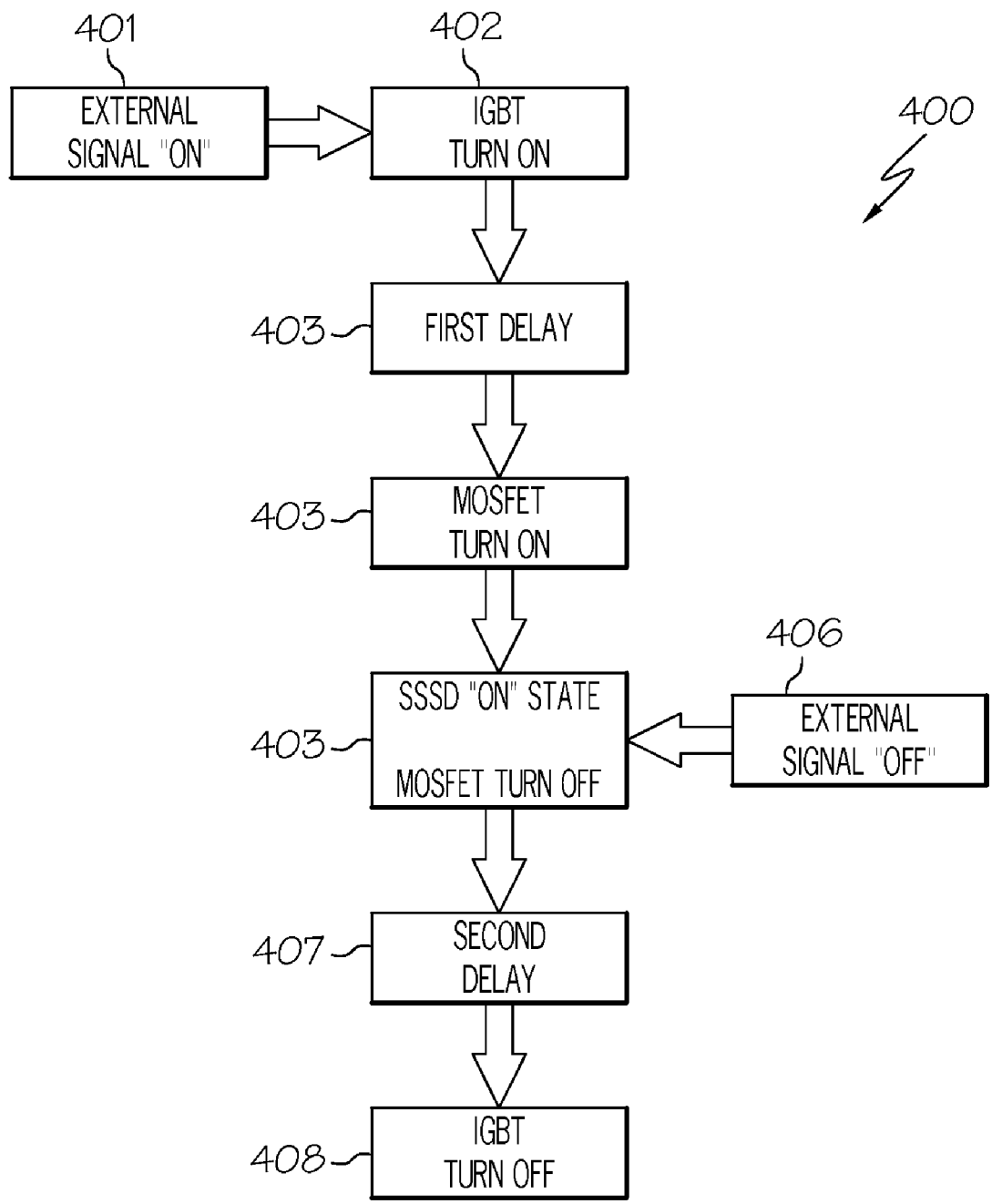
FIG. 4 depicts a flow chart according to a method of the present invention.

The flow chart of FIG. 4 depicts steps 400 of present invention. An external signal 401 may cause a step 402 of connecting a power input to a power output through the IGBT. After delaying 403 for the dissipation of inrush current, step 404 of connecting the power input to the power output through the MOSFET may follow that would bring the SSSD into an active state. With the SSSD in the active state, an external signal 406 may cause a step 405 of disconnecting the power input from said power output through the MOSFET. After delaying 407 for switching off of the MOSFET, a step 408 of disconnecting the power input from the power output through the IGBT may return the SSSD to the initial state.

The SSSD of present invention may improve reliability and fault current handling by relying on the switch 12 (112, 212) to handle switching transients and breaking up the fault current because a single IGBT typically has much higher current rating than a single MOSFET of similar size. The SSSD of the present invention may achieve higher current ratings in SSPC applications for lower than 1.7V voltage drop by connecting in parallel additional MOSFETs with no limit of the fault current handling capability of a single MOSFET. The switch 12 (112, 212) may provide over voltage protection for the SSSD during heavy inductive load switching off, fault current breaking up transients, and lightning transients.

It should be understood, of course, that the foregoing relates to exemplary embodiments of the invention and that modifications may be made without departing from the spirit and scope of the invention as set forth in the following claims.

We claim:

1. A method of switching a solid state switching device having at least one metal oxide semiconductor field effect transistor and at least one insulated gate bipolar transistor connected in parallel comprising the steps of:
   connecting on demand a power input to a power output through said insulated gate bipolar transistor;
   delaying for the dissipation of inrush current of said insulated gate bipolar transistor;
   connecting said power input to said power output through said metal oxide semiconductor field effect transistor;
   disconnecting on demand said power input from said power output through metal oxide semiconductor field effect transistor;
   delaying for switching off of said metal oxide semiconductor field effect transistor; and
   disconnecting said power input from said power output through said insulated gate bipolar transistor.

2. The method of claim 1, further comprising a step of connecting a feedback circuit between said power output and a gate of said insulated gate bipolar transistor.

3. The method of claim 2, further comprising a step of activating said feedback circuit when a voltage at said power output exceeds a predetermined level.

4. The method of claim 3, wherein said feedback circuit alters a connection of said power input to said power output through said insulated gate bipolar transistor for maintaining said voltage at said predetermined level.

5. A method of switching a solid state switching device having at least one metal oxide semiconductor field effect transistor and at least one insulated gate bipolar transistor connected in parallel comprising the steps of:
   connecting on demand a power input to a power output through said insulated gate bipolar transistor;
   delaying for the dissipation of inrush current of said insulated gate bipolar transistor;
   connecting said power input to said power output through said metal oxide semiconductor field effect transistor;
   conveying negative feedback from said power output to said insulated gate bipolar transistor;
   disconnecting on demand said power input to said power output through said metal oxide semiconductor field effect transistor;
   delaying for switching off of said metal oxide semiconductor field effect transistor; and
   disconnecting said power input from said power output through said insulated gate bipolar transistor.

6. The method of claim 5, wherein said conveying of said negative feedback occurs when a voltage at said power output exceeds a predetermined level.

7. The method of claim 6, wherein said conveying of said negative feedback alters said connection of said power input to said power output through said insulated gate bipolar transistor for maintaining said voltage at said predetermined level.

8. A solid state switching device comprising:
   a first metal oxide semiconductor field effect transistor; and
   a first insulated gate bipolar transistor connected in parallel with said metal oxide semiconductor field effect transistor;
   a reverse biased zener diode connecting a collector and a gate of said first insulated gate bipolar transistor;
   wherein said first metal oxide semiconductor field effect transistor turns on with a first predetermined delay after said first insulated gate bipolar transistor turns on and said first insulated gate bipolar transistor turns off with a second predetermined delay after said first metal oxide semiconductor field effect transistor turns off.

9. The solid state switching device of claim 8, further comprising multiple metal oxide semiconductor field effect transistors connected in parallel and turning on and off synchronously.

10. The solid state switching device of claim 8, wherein said reverse biased zener diode having a predetermined breakdown voltage generates a negative feedback for maintaining an output voltage of said solid state switching device at a predetermined level.

11. The solid state switching device of claim 8, further comprising, for handling of AC current, a second metal oxide semiconductor field effect transistor, a second insulated gate bipolar transistor, and first and second diodes, wherein said second metal oxide semiconductor field effect transistor is connected in series and in opposite polarity with said first metal oxide semiconductor field effect transistor, said second insulated gate bipolar transistor is connected counter-parallel with said first insulated gate bipolar transistor, said first and second diodes are connected in series with said first and second insulated gate bipolar transistors correspondingly, said second metal oxide semiconductor field effect transistor turning on and off synchronously with said first metal oxide semiconductor field effect transistor, and said second insulated gate bipolar transistor turning on and off synchronous with said first insulated gate bipolar transistor.

12. The solid state switching device of claim 11, wherein said first and second diodes are incorporated within said first and second insulated gate bipolar transistors correspondingly.

13. The solid state switching device of claim 11, comprising multiple pairs of metal oxide semiconductor field effect transistors connected in parallel with said first and second metal oxide semiconductor field effect transistor and turning on and off synchronous with said first metal oxide semiconductor field effect transistor.

14. The solid state switching device of claim 11, comprising a first link, containing a first reverse biased zener diode connected in series and in opposite polarity with a first conventional diode, connecting a collector and a gate of said first insulated gate bipolar transistor and a second link, containing a second reverse biased zener diode connected in series and in opposite polarity with a second conventional diode, connecting a collector and a gate of said second insulated gate bipolar transistor, wherein said gate of said first metal oxide semiconductor field effect transistor is connected to said gate of said second metal oxide semiconductor field effect transistor.

15. The solid state switching device of claim 14, wherein said first and second reverse biased zener diodes have equal predetermined breakdown voltages.

16. The solid state switching device of claim 15, wherein said first and second reverse biased zener diodes generate a negative feedback for maintaining an output voltage of said solid state switching device at a predetermined level.

* * * * *